US006392935B1

(12) United States Patent
Mulholland

(10) Patent No.: US 6,392,935 B1
(45) Date of Patent: May 21, 2002

(54) MAXIMUM BANDWIDTH/MINIMUM LATENCY SDRAM INTERFACE

(75) Inventor: Brent Mulholland, Boulder, CO (US)

(73) Assignee: Maxtor Corporation, Longmont, CO (US)

( * ) Notice: Subject to any disclaimer, the term of this patent is extended or adjusted under 35 U.S.C. 154(b) by 0 days.

(21) Appl. No.: 09/825,201

(22) Filed: Apr. 3, 2001

Related U.S. Application Data

(60) Provisional application No. 60/194,145, filed on Apr. 3, 2000.

(51) Int. Cl.[7] .................................................. G11C 7/00
(52) U.S. Cl. ............. 365/189.05; 365/221; 365/230.03; 365/230.08
(58) Field of Search .......................... 365/233, 189.05, 365/221, 230.08, 230.03

(56) References Cited

U.S. PATENT DOCUMENTS

| | | | | |
|---|---|---|---|---|
| 5,422,856 A | * | 6/1995 | Sasaki et al. ........... | 365/230.03 |
| 5,490,113 A | * | 2/1996 | Tatosian et al. ........ | 365/189.05 |
| 5,666,323 A | | 9/1997 | Zagar .................... | 365/233 |
| 5,784,705 A | * | 7/1998 | Leung ................... | 365/189.05 |
| 6,052,756 A | | 4/2000 | Barnaby et al. ........ | 711/105 |
| 6,067,270 A | | 5/2000 | Hwang .................. | 365/230.03 |
| 6,094,397 A | | 7/2000 | Hadderman et al. .... | 365/230.03 |
| 6,125,432 A | | 9/2000 | Hanami et al. ......... | 711/157 |
| 6,130,843 A | | 10/2000 | Lee ...................... | 365/189.05 |
| 6,130,848 A | | 10/2000 | Kuo et al. .............. | 365/207 |
| 6,154,418 A | | 11/2000 | Wen Li .................. | 365/233 |
| 6,163,501 A | * | 12/2000 | Ohshima et al. ....... | 365/233 |

OTHER PUBLICATIONS

Article: IBM, at www.chips.ibm.com, 6 Pages, Oct. 18, 2000.
Article: DRAM Technologies, at www.pcguide.com, 4 Pages, Oct. 18, 2000.

* cited by examiner

Primary Examiner—Son T. Dinh
(74) Attorney, Agent, or Firm—David M. Sigmond

(57) ABSTRACT

A multi-bank dynamic random access memory (DRAM) device is configured such that the bandwidth for performing data transfers is increased and the latency when performing the operations is decreased. The memory device when incorporated in a computer system may be configured such that data requests are received from one or more other devices in the system for data transfer functions. Further, through the interleaving of access to the multiple banks within the memory array, various set-up functions are performed on one bank while data transfer functions are performed on another bank, thus effectively hiding such functions.

50 Claims, 6 Drawing Sheets

MAXIMUM BANDWIDTH/MINIMUM LATENCY SDRAM INTERFACE

This application claims priority under 35 U.S.C. §119 to prior U.S. Provisional Patent Application Ser. No. 60/194,145, filed Apr. 3, 2000, the entirety of which is hereby incorporated by reference.

FIELD OF THE INVENTION

The invention described herein relates to an interface for the transfer of data to and from a multi-bank dynamic random access memory (DRAM), and more particularly to an interface which provides for efficient utilization of bandwidth as well as minimum latency between receiving a request for transfer and the performance of such request.

BACKGROUND OF THE INVENTION

As technology has evolved with regards to computer systems, there has been a demand for faster, high-capacity, random access memory (RAM) devices. RAM devices, such as dynamic random access memory (DRAM) are typically used as the main memory in computer systems. Conventionally, a DRAM is a memory that accesses data in a memory through use of timed asynchronous control signals. Although the operating speed of the DRAM has improved over the years, the speed has not reached that of processors used to access the DRAM. As such, slow access and cycle times of the DRAM may lead to system bottlenecks.

An improvement in memory speed has come in the form of a synchronous DRAM (SDRAM). A SDRAM is a clock driven memory that transfers data synchronously with the system clock. Specifically, input and output functions for the SDRAM are synchronized to an active edge of the system clock which is driving the processor accessing the SDRAM. A typical SDRAM is configured to include multiple banks of memory cells for performing the read and write functions. Also included in the SDRAM are a number of row decoders employed so that word lines within each bank of memory cells can be controlled in an interleaved fashion to improve data transfer efficiency.

SUMMARY OF THE INVENTION

The inventor has recognized that in a DRAM device where multiple memory banks are employed, there are certain overhead functions initiated during read or write functions for the memory banks which may be hidden by performing concurrent operations for multiple memory banks. The inventor has further recognized that by controlling the configuration of data requests received from external sources, the bandwidth of data transferred may be increased and the latency with data requests that are entered may be reduced.

Described herein is a system and method for performing data transfers in a multi-array dynamic random access memory (DRAM) type device. Included in the system is a data buffer device which is connectable to the memory arrays. The data buffer device is configured such that it receives data requests from one or more devices in a computing system and provides for the data transfer according to the data request. In connection with the data buffer is a control circuit which provides for the selection of pending data requests and provides control signals to the data buffer to control the manner in which data requests are to be performed.

In particular, the control circuit is configured such that data transfers are performed with regards to the memory array in an interleaving fashion with regards to the plurality of memory banks. In one configuration of the invention, the memory array is configured to comprise a plurality of memory addresses where each address includes a bank 0 and bank 1. During operation of the memory device, data is transferred in an interleaving fashion between bank 0 and bank 1. The control circuit and the data buffer processes data requests in a manner such that the set-up functions performed with regards to transferring data for a particular bank may be performed while the actual data transfer is occurring for the other bank. For example, while a data transfer (i.e., read or write) is being performed for bank 0 at a particular address, a precharge function may be initiated for bank 1. Then, while the data transfer continues to bank 0, the activate function may be initiated for bank 1. Finally, when the data transfer for bank 0 is complete, the data transfer for bank 1 may be started.

The control circuit may be further configured such that data requests are performed in such a manner that each data request processed ends on a specified data boundary. For example, if each bank at a particular address is configured to receive eight words, such that each address is limited to a sixteen word data transfer, the control circuit may be configured such that regardless of the size of the data included in a particular data request, the request is only honored to the extent that bank 0 and bank 1 for a specified address are filled. This will be true even if the data request is for transferring an amount of data greater than that is available in a specified address. As such, the control circuit will not fulfill the whole request. In order to monitor amounts of data transferred, the system may include an apparatus which accounts for the amount of data transferred according to a particular request, and if the total amount is not transferred, generating a new data request which includes the untransferred data. In yet another configuration of the invention, the data request may be limited such that it does not exceed a particular size, for example sixteen words.

The control circuit may be further configured such that the interleaving process which provides one or more overhead operations may be performed when switching between different addresses in the memory array. As an example, the control circuit may initiate a precharge of bank 1 of an address for which a data transfer has been performed, while performing an activate of bank 0 in an address to which a future data transfer is to be performed. This type of overlapping function may further be performed while the system is switching between data requests from different devices in the disk drive.

In operation, the system described herein detects one or more requests for a data transfer from other devices within the disk drive. Upon selection of a particular data request to honor, an address in the memory to make the transfer is identified. As was discussed above, the particular address will include a bank 0 and a bank 1 and a determination will be made wherein either bank 0 or bank 1 the data transfer is to begin.

At this point, the system will begin performing all the overhead functions necessary for performing the data transfer. These include the activation of the bank, the actual performance of the data transfer, as well as the precharge and equalization of the memory cells. As was described above, the steps are performed in such a manner that steps for bank 0 and bank 1 are performed concurrently. During the actual data transfer, a monitoring process is performed whereby only enough data is read from or written to a particular address. Once the data transfer for that particular address is complete, a "done" command is transmitted to the device which had made the data request.

During the performance of the transfer, the data device monitors the amount of data transferred and upon receiving the "done" command, makes a determination as to whether all data identified in the data request has been transferred. The monitoring process may be performed through a count of the data strobe signal to determine how many words were transferred. If a determination is made that not all the requested data has been transferred, the data device will reconstitute its data request and provide it to the data buffer.

DETAILED DESCRIPTION

Figure 1:
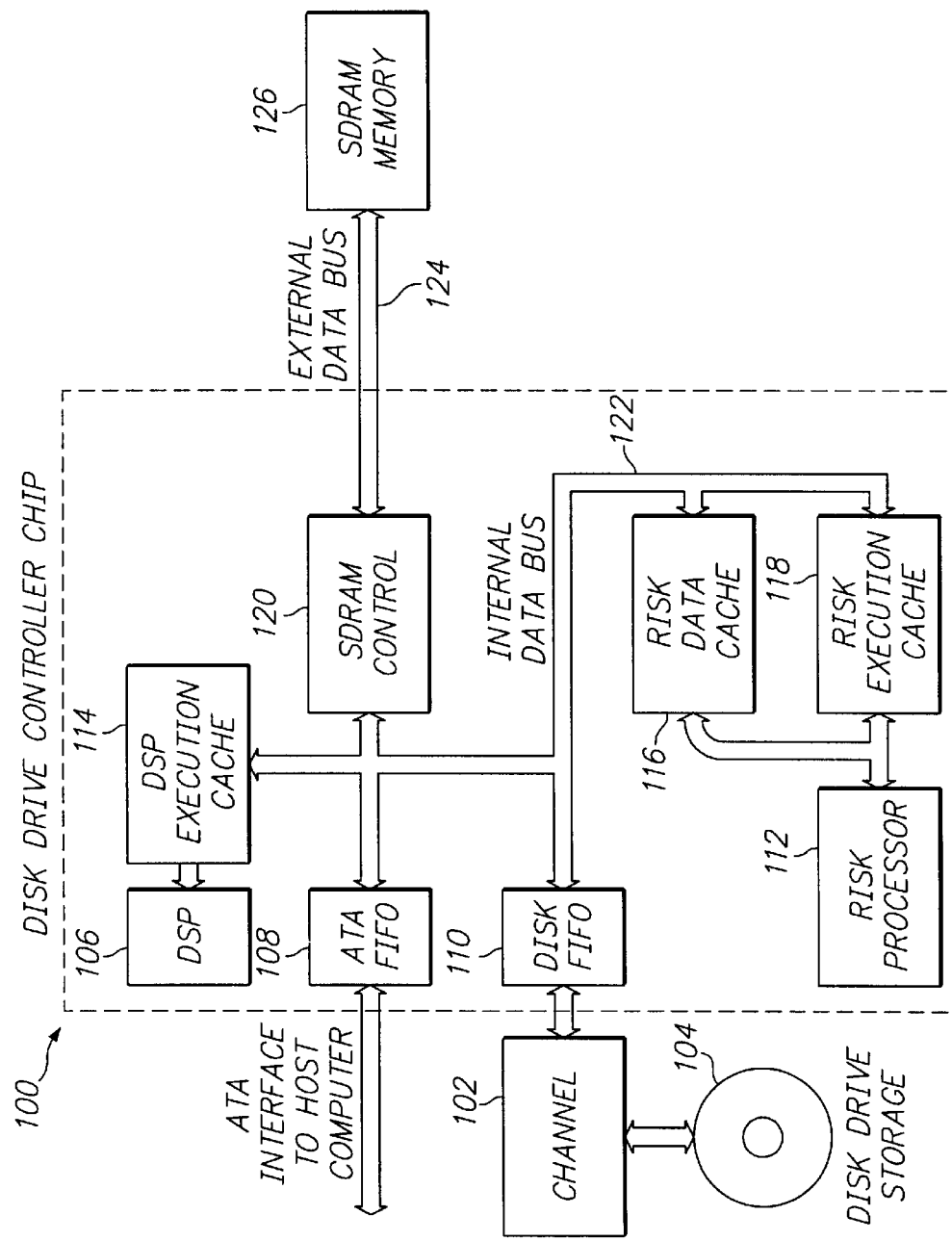
FIG. 1 discloses a system diagram for a disk drive within which an SDRAM device may operate.

Disclosed in FIG. 1 is a diagram for a disk drive within which the SDRAM device 100 may operate. Included in the disk drive is the SDRAM controller 120 which controls the data transfers between the SDRAM 100 and the devices on the internal data bus 122. The devices on the internal data bus 122 which can generate requests for data to the SDRAM controller are: 1) the host FIFO 108, which transfers data between the SDRAM and the host computer. 2) The disk FIFO 110, which transfers data via channel 102 between the SDRAM with the disks in the drive 104. 3) The DSP 114 execution cache, which can retrieve its operating instructions from the SDRAM. 4) The risk processor execution cache 118 in connection with risk processor 112, which can retrieve its operating instructions from the SDRAM. 5) the risk processor data cache 116 also connection with risk processor 112, which can transfer code variables to the SDRAM. The SDRAM control 120 is further in connection with the SDRAM memory 126 over external data bus 126. The processing and performance of these data requests to the SDRAM will be described in greater detail below.

Figure 2:
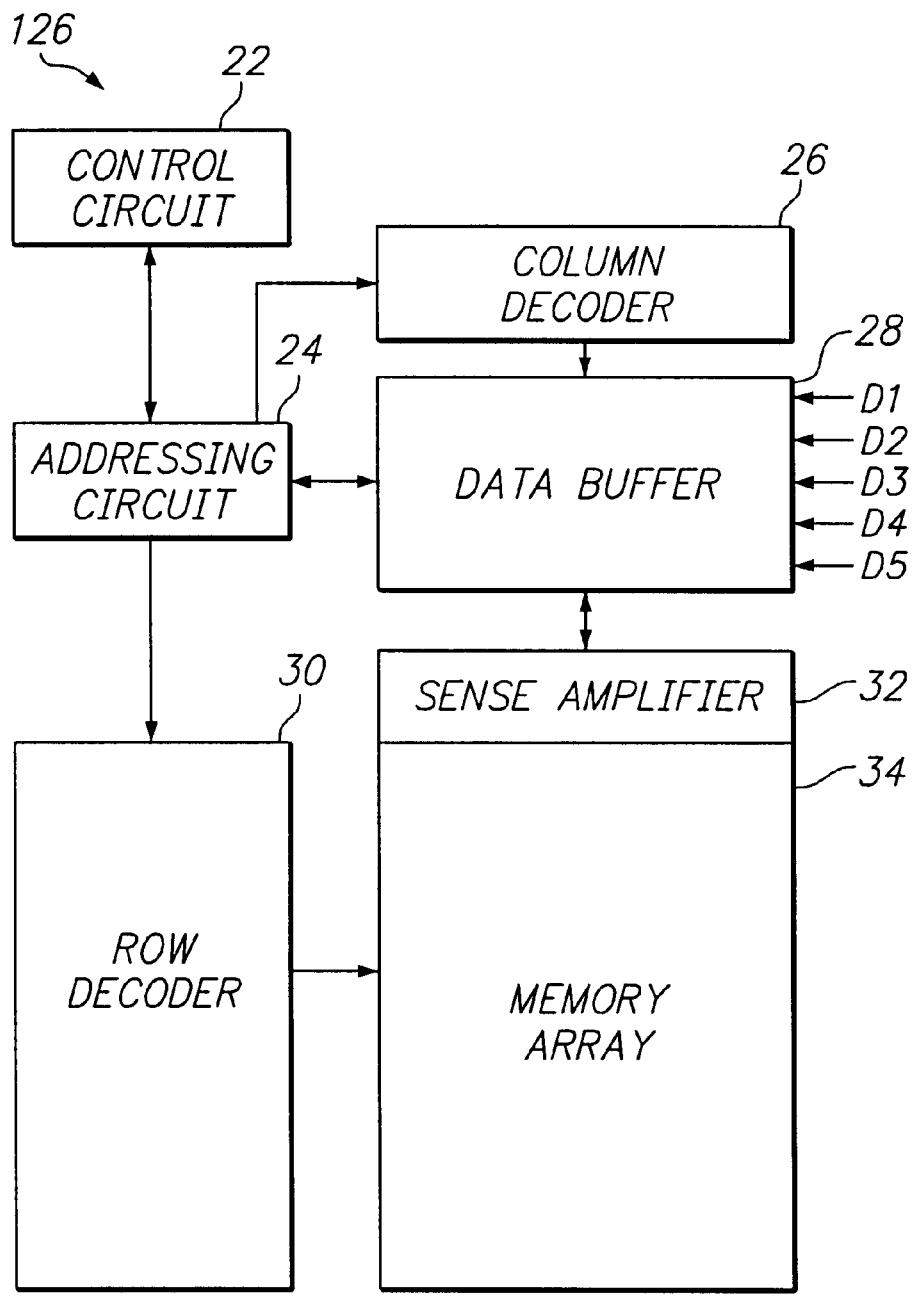
FIG. 2 discloses a system diagram for an embodiment of an SDRAM type device as described herein.

Disclosed in FIG. 2, is a system diagram for SDRAM memory 126. Included in the SDRAM device is a control circuit 22 which is employable for generating any number of control signals which are transmittable to other elements of the SDRAM device for controlling various functions. These functions may include providing direction to the addressing circuit 24 for generation of signals for selecting rows and column address in the memory array 34, and for the performance of data transfers in response to data requests received at data buffer 28. The row and column select signals generated by addressing circuit 24 are transmitted to row decoder 30 and row column decoder 26. These decoders provide for the activation of particular addresses within the memory array 34 which are to be employed in a data transfer.

The addressing circuit 24 is also in connection with data buffer 28 and through this connection receives memory address information extracted from the data requests. The addressing circuit may employ this information to generate signals which are transmitted to the row and address decoders, which in turn activate the appropriate row and column for the memory array 34.

Sense amplifier 32 is incorporated into memory 34 and includes circuitry for precharging an equilibrating memory cells employed in the data transfers. The memory 34 is made up of a plurality of arrays where each array includes a number of memory cells which are aligned in rows and columns. Each row in the arrays may be associated with an address and may be sized such that it receives a known quantity of data. In the system described herein, each address (which includes rows in a plurality of arrays) is configured such that it may store a maximum of 16 words. Although only one array is shown in the embodiment described herein, one skilled in the art would know that in a typical SDRAM device, multiple memory arrays are employed which provide for the interleaving functionality during the data transfer process. For the purposes of this application two memory arrays will be discussed herein described (bank 0 and bank 1), however it is conceivable that more than two arrays are possible. Each array include its own row and column decoder as well as sense amplifiers.

In connection with the memory arrays 34, is data buffer 28. Data buffer 28 provides the interface between the SDRAM and the external data devices described in FIG. 1. Data requests received from the external data device are received as data signals D1–D5. These signals are received at predetermined data ports in the data buffer 28.

The SDRAM device described herein is specially configured to provide an efficient utilization of bandwidth for data transfers and to provide minimum latency for processing data requests from the various data devices. As is well known, memory cells in a DRAM device must first be activated before a data transfer, and a precharge shall occur to equalize the cells after the transfer. The total time (overhead) it takes to perform these functions may add to the total amount of time it takes to perform a data transfer. Previously, adding precharge and activate times to the time of the transfer could not be avoided, but the bandwidth through the DRAM could be improved by increasing the amount of data requested to/from the DRAM. The drawback of this was that certain ports were occupying an enormous amount of time and other ports, which were not having the request honored, were showing lowered performance.

More specifically a SDRAM access would occur in the following manner: A) honor a request from a port, typically three or more clock cycles, B) activate SDRAM row access, three clock cycles, C) transfer data, one to sixteen clock cycles, D) precharge SDRAM, three cycles, and E) start a new cycle to honor a request. It can be seen that each access of the SDRAM has at least nine cycles of overhead while transferring up to sixteen words. As such, a maximum efficiency of 64% on the SDRAM bus could be expected for all accesses of sixteen words. In actuality, since not all requests are for sixteen words, the bus efficiency may be less than 50%.

According to the system and method described herein, much of the overhead associated with processing data transfer requests may be hidden. As was described above, the SDRAM has two arrays of data cells available for data transfer. In general, the system operates by performing activation and precharge functions on one array while performing either a read or write with regards to the other array. A further feature incorporated into the system herein controls the types of data requests which will be honored by the data buffer and control circuit. Specifically, the system described herein may be programmed to only perform data requests for segments of data until a sixteen word boundary is reached.

As a rule, most of the data commands for transferred data from the DRAM is sequential in nature. By transferring data starting on sixteen word boundaries and transferring sixteen words at a time, that is eight words to bank 0, and eight words to bank 1, it ensures the next transfer will start on bank 0 again. By making all transfers perform in this way, overhead associated with the banks can be substantially hidden. Further, if a transfer is requested that does not start on a sixteen word boundary, only enough data to make the next data transfer to start on a sixteen word boundary will be made.

Additionally, the overhead associated with setting up the next port to access the SDRAM may be hidden by utilizing pipelining and staging registers. While a transfer is occurring, the buffer manager may be configured to honor the next request to access the SDRAM. More specifically, an access to a single bank of the SDRAM requires a row address for the activate command and a column address for the read/write command. Once the last column address has been sent to the SDRAM the controller can choose the next requester. Thus, the steps of honoring a request, data transfer, and pre-charge steps A, C are hidden.

Figure 3A:
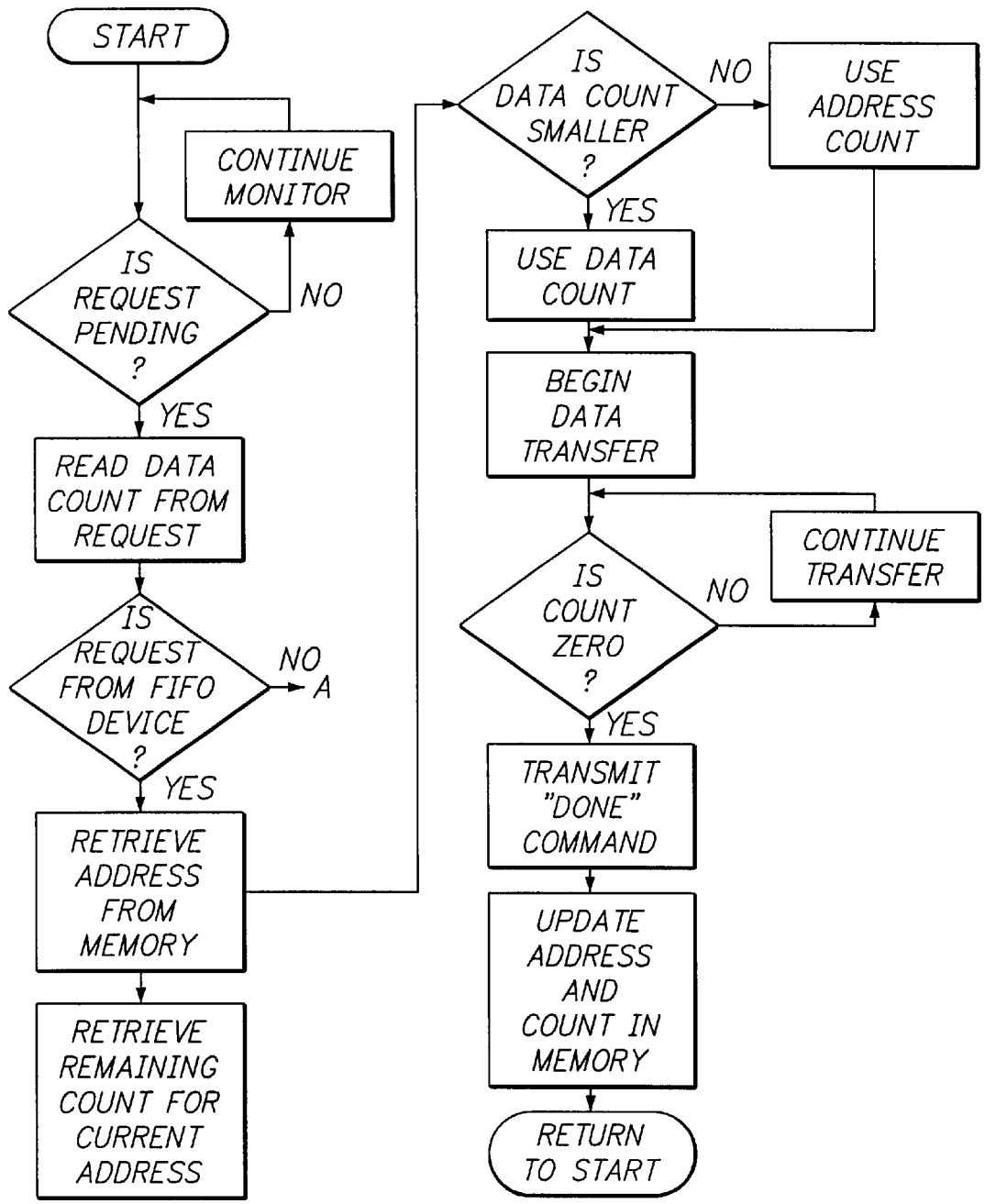
FIGS. 3a–c disclose flowcharts which describes the operations performed by the controller circuit in conjunction with the data buffer when performing data transfers in the memory array.
Figure 3C:
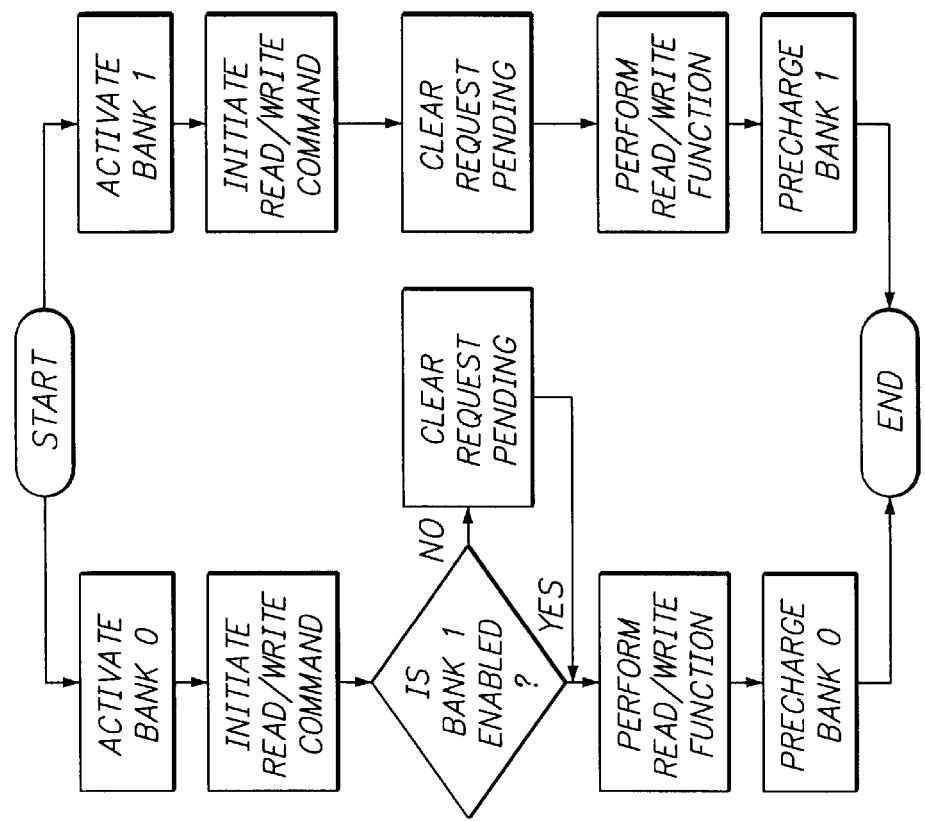
Figure 3B:
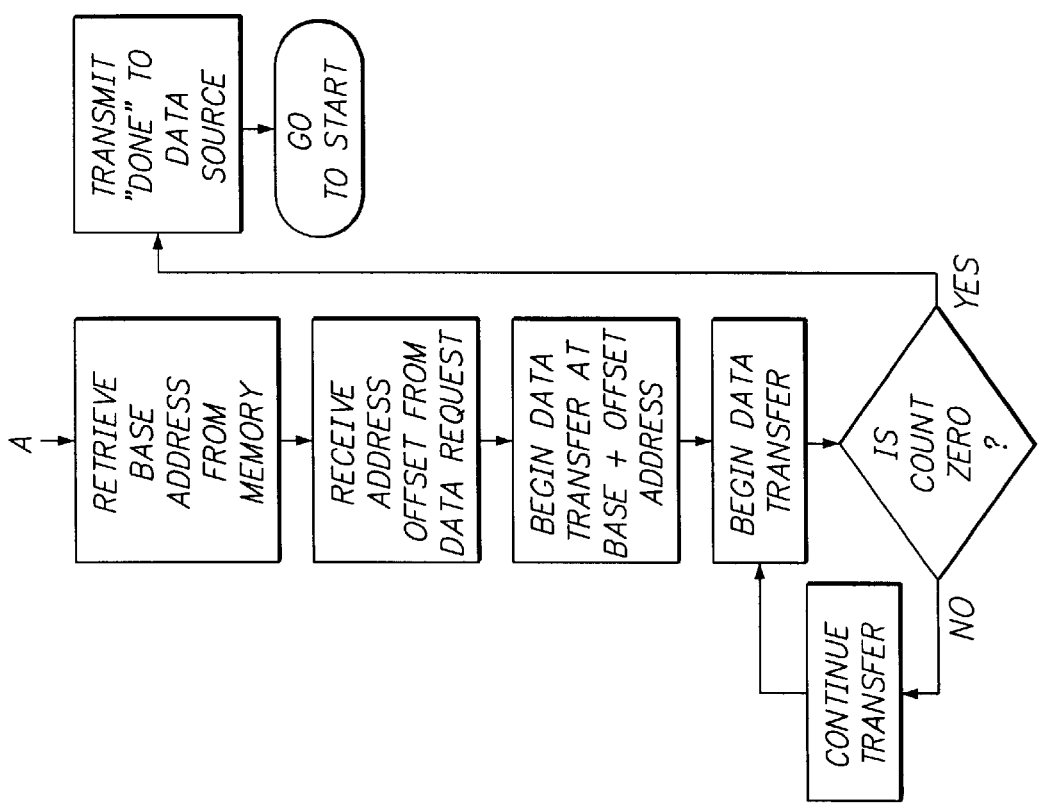

Disclosed in FIGS. 3a and 3b are flowcharts which describes the operations performed by the data buffer and control circuit in response to data requests received from the various data devices. As was described above, data requests are received from a number of different data devices connected to a common data bus in the disk drive. Each of these data devices employs its own port into the data buffer, and the control circuit in conjunction with the data buffered decides which data requests are to be honored according to a number of predetermined criteria.

According to the flowchart in FIG. 3a, a determination is first made at the data buffer as to whether a data request is pending. If not, the system continues in an idle mode until a data request is detected over one of the ports. If a request is detected, a first determination is made as to whether the request is received from a first-in-first-out (FIFO) data device or from other non-FIFO devices within the computer system. If a FIFO device is detected, the request will include a data amount which comprises the total number of words to be transferred during performance of the data request. As was mentioned above, the data devices in the disk drive may be programmed such that a data request may not exceed a certain number of words. According to the configuration of the invention, wherein each bank provides for the transfer of eight words, each data request is limited to sixteen words.

As was mentioned previously, if the data device is a FIFO type device, data which is written to or read from the SDRAM is sequential in nature. As such, the last address accessed by the particular FIFO data device is stored in memory in the buffer manager and when a data request for the particular data device is again processed, this information is read from memory. The buffer manager also maintains a count for the FIFO device for how much data can be requested before a new address has to be accessed for transferring data. If during the transfer, the count goes to zero, the buffer manager will identify another address for which future transfers are to be made for the particular device. This may be retrieved from a link list to get the next starting address and next link list pointer. Once the address and account information is retrieved, the data transfer process may continue.

The actual steps performed in a data transfer for a particular address with regards to the accessing, performing and read/write are described in the flowchart for FIG. 3c. This process is performed in substantially the same manner regardless of the type of data device (FIFO or non-FIFO) for which the request is being performed. The flowchart in FIG. 3c has been laid out in a manner such that the operations performed with regards to bank 0 and bank 1 in an address are viewable in a chronological fashion. As can be seen in the flowchart, a number of operations for the banks are performed simultaneously which provides for the hiding of various overhead functions. During the performance of a data transfer, the first step initiated by the system is the activation of bank 0. Immediately thereafter, bank 1 may be activated as well, or it could occur while the data transfer is occurring for bank 0. Thereafter an initiation may occur of a read/write command with regards to bank 0. At this point, the data transfer with respect to bank 0 may be performed. Immediately after the data transfer for bank 0 has finished the read/write command may be initiated for bank 1.

During the actual data transfer with regards to bank 1, the step of pre-charging bank 0 may occur. Finally, with regards to a data transfer being performed with regards to a particular address, the precharge function for bank 1 may be performed. In the situation where another data request is performed immediately thereafter at a different address, the functions performed with regards to bank 0 and bank 1 at the new address, one or more overhead functions may be performed while the precharge is occurring for bank 1 in the original address. The system described in here is configured such that it can analyze data requests which are to be honored and may performed the various activate functions on one address while finishing the data transfer and performing a precharge at the previous address.

As was mentioned previously, when the read/write command has occurred for bank 1 the request pending is cleared and, if there are any requests active, a new request is honored. If a read/write command has occurred for bank 0, and there will not be a transfer to bank 1 for the current request, once again the request pending is cleared and, if there are any requests active, a new request is honored.

Returning again to the process described in the flowchart of FIG. 3a, for FIFO device transfers, the data buffer tracks the count remaining with regards to the transfer of words to a particular address. When the count goes to zero, regardless of the amount of data requested, the system discontinues the current transfer and transmits a "done" command to the device making the data request. At this point, the memory in the buffer manager is updated to note the start point for the next data transfer from the particular FIFO device. As will be described in greater detail below, if the data request is not completely fulfilled, the FIFO device which just made the request will generate a new data request for any untransferred portions.

Disclosed below are three examples which describe the results achieved when performing data transfers for FIFO devices in a number of different scenarios. They are as follows:

Example one:
Data Request size=16
Starting address=zero
Count remaining=16
Transfer=16 words=8 from bank 0, 8 from bank 1
Example two:
Data size=16
Starting address=4
Count remaining=16
Transfer=12 words=4 from bank 0, 8 from bank 1
Example three:
Data size=16
Starting address=4
Count remaining=10
Transfer=10 words=4 from bank 0, 6 from bank 1.

Referring again to the flowchart of FIG. 3a, if the data device is not an FIFO device, the steps performed by the system described herein are slightly different. These steps are described in greater detail in FIG. 3b. Once the system elects to process a data request from a non-FIFO device, a base address associated with the particular device is retrieved from a register in the controller. Included in the data request from the non-FIFO device is an offset address which, when added to the base address, forms the starting address for the data transfer to begin. As with the data request from the FIFO devices, the data size for a data request is limited to sixteen words. Once the offset address is noted, the data transfer may be performed in substantially the manner as was described in FIG. 3c above. As with the data transfer request processed for FIFO devices, the data buffer and control circuit will perform a transfer until a 16-word address boundary is reached and will issue a "done" command signal when the particular transfer for that address is complete, regardless of whether the entire data request has been fulfilled. Once the "done" command is issued, the control circuit and buffer manager will update the memory in the buffer manager to indicate where the data transfer shall begin for the next data request from that particular data device.

Disclosed below are two examples of data requests made from non-FIFO devices and how they are processed by the system described herein. They are as follows:
Example one:
Data size=12
Offset address=0
Base address=0
Transfer=12 words=8 from bank 0, 4 from bank 1
Example two:
Data size=16
Offset address=6
Base address=0
Transfer=10 words=2 from bank 0, 8 from bank 1.

As was described above, in many situations, an entire data request from a particular data device will not be completely filled by the system. As such, when a particular device determines that its request has not been completely fulfilled, it will generate a new data request to transfer the remaining portions. As with the requests fulfilled by the data buffer described above, the FIFO and non-FIFO devices perform their functions in slightly different ways.

Figure 4:
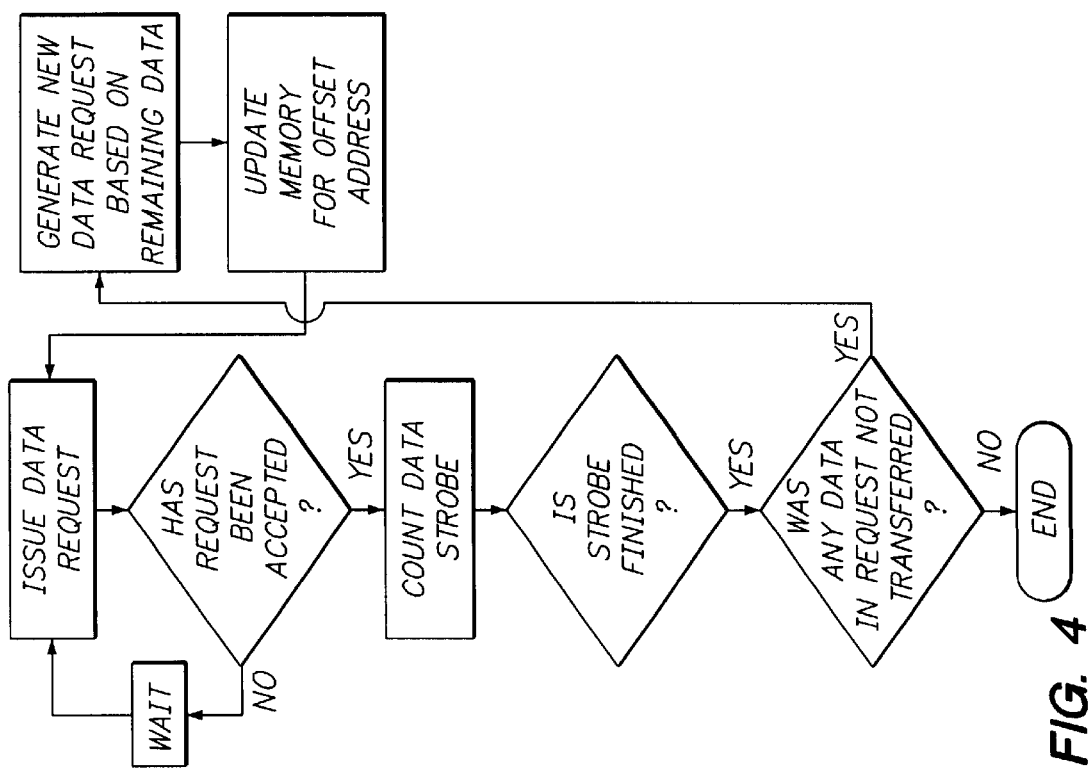
FIG. 4 discloses a flowchart which describes in detail the steps performed by a first-in-first-out (FIFO) data device during a data transfer process.

Disclosed in FIG. 4 is a flowchart which describes the operations performed by an FIFO device when making a particular data request. As an initial step, the FIFO device creates a data request which includes the size of data which is to be transferred. This data request is transmitted over the assigned data port to the data buffer. Depending on how the system is configured, the particular data device may have to wait a certain period of time until its data request is honored. Once the request is honored, the data transfer begins and the data device monitors the amount of data transferred by counting transitions in a data strobe signal, which in an SDRAM system, provides an indication of the number of words transferred. The data device will keep a count of the number of strobes and when the data transfer process is complete for a particular address, a comparison will be made between the number of data strobes and the amount of data to be transferred according to the data request. If it is determined that less data was transferred than was requested, the data device will generate a new data request which includes the new amount of data to be transferred. This process will repeat itself until all the data identified in the original data request is transferred.

Figure 5:
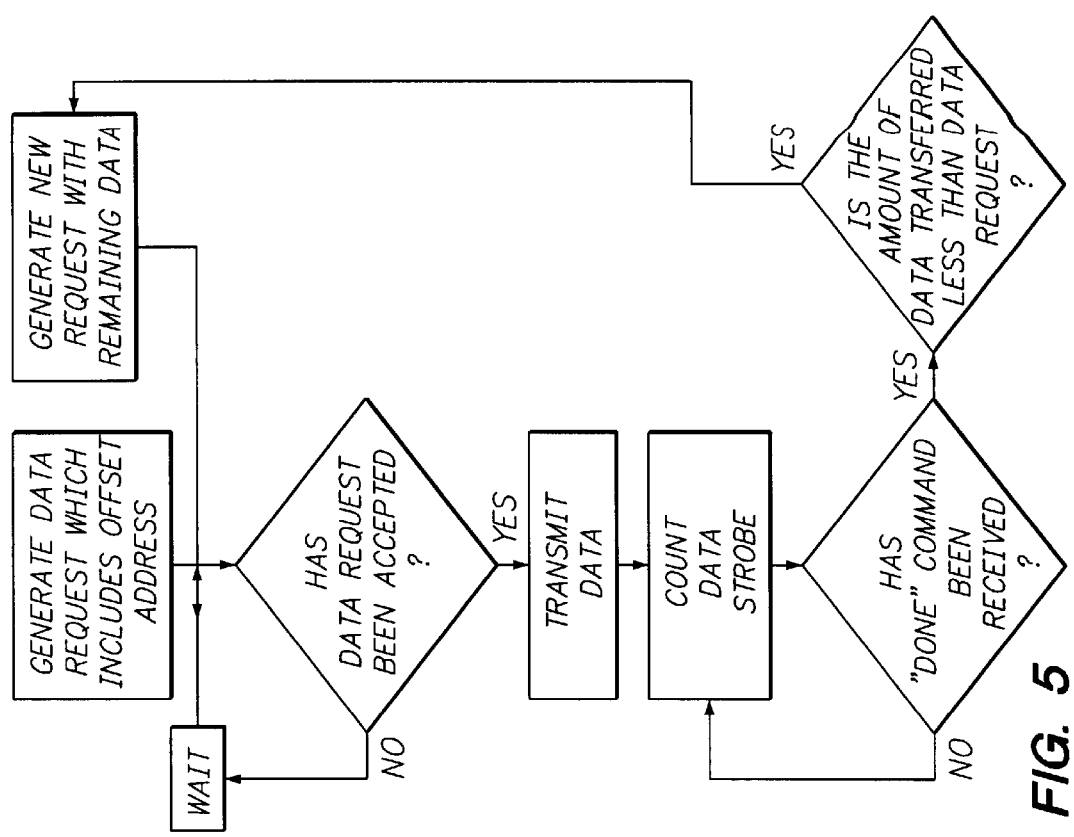
FIG. 5 discloses a flowchart which describes in detail the steps performed by a non-FIFO data device during a data transfer process.

Disclosed in FIG. 5 is a flowchart which describes the operations performed by a non-FIFO data device when making a data request. As an initial step, a data request is generated which includes the amount of data to be transferred as well as an offset address which is to be employed by the system in determining a starting point for the data transfer within the address retrieved from memory in the data buffer. The non-FIFO data device will wait until its data request is accepted by the data buffer and once this occurs, the transfer of data will begin. As with the FIFO data device, the non-FIFO data device will count the data strobes which occur during the transfer. Once the "done" command is detected from the data buffer, the data device will compare the amount of data actually transferred versus the amount of data to be transferred according to the data request, and make a determination if all of the data has been transferred. If all of the data has not been transferred, a new data request is generated which includes the remaining data, and the process begins again.

Figure 6:
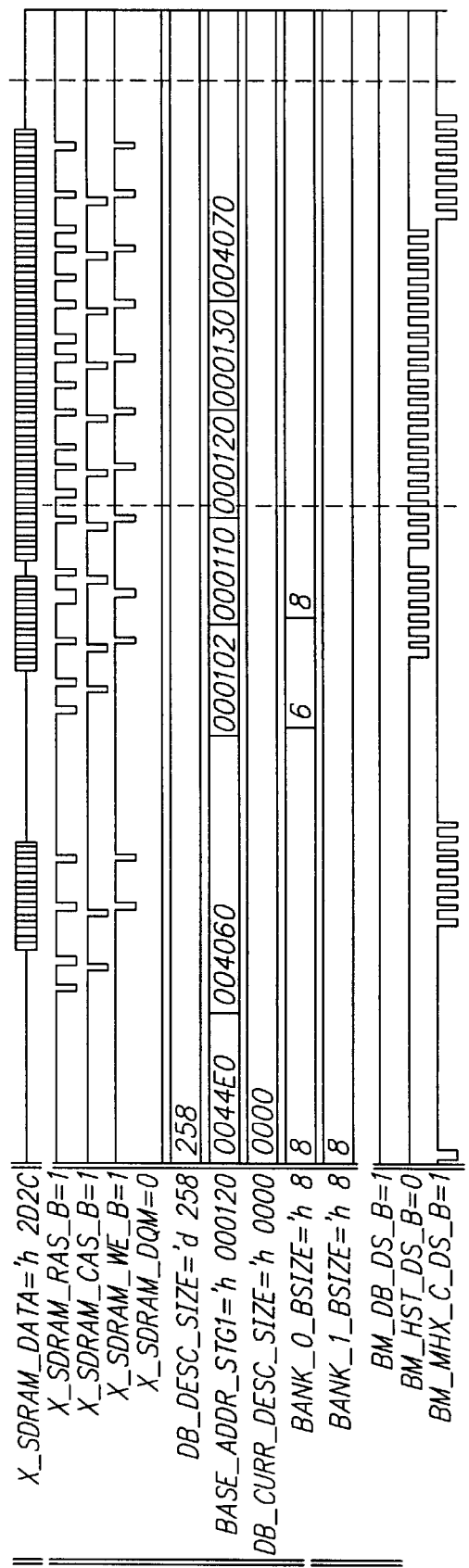
FIG. 6 discloses a timing diagram which particular the control signals and data strobes employed in reading data from a plurality of addresses in the memory array.

In order to better understand the operations of the system, a timing diagram is provided in FIG. 6 which includes the control signals generated within the system and provides an indication of the operations performed by the system in a chronological manner. It is apparent from the timing diagram as to the manner in which a number of operational steps are hidden, and how the data transfers are controlled so that they mostly end on a designated word boundary. According to the system described herein, data requests are indicated by a host data device (HST) and disk data device (DB), both of which are FIFO devices, and non-FIFO device (MHX). Other data signals included in the diagram include the row address strobe (RAS), the column address strobe (CAS), write enable (WE). Indications are also provided in the timing diagram for the address being accessed (BASE_ADDR) and the available size of the particular bank (BANK_0_SIZE, and BANK_1_SIZE) in the current address.

In the example timing diagram shown in FIG. 6, a number of read functions are being performed for the different data devices. To be more precise, a read is initially made for the MHX device, four reads are made for the HST device and then another read is made with regards to the MHX device. The starting address for the read is 4060, the starting address in a 16-word address. The address is manipulated to become the row and column addresses (although not shown) for the MHX accesses to bank 0 and bank 1. With regards to the initial read to the MHX device, it is seen that the RAS signals initiate an activate command for bank and then the CAS signal initiates a read function. At this point a number of concurrent operations may begin for banks 0 and 1. While the read is being performed for bank 0 (which is indicated by the data strobe for the MHX device) the activate command for bank 1 is transmitted. It should be noted that there is a delay of a few clock cycles between the data strobe requesting a read and the issuance of the read command due to the time it takes to transfer data from the memory to the particular data device. This situation would be reversed for a write command.

Upon completion of the read for bank 0, the read for bank 1 begins and while this read is happening a precharge is performed for bank 0 (indicated by the simultaneous lows of the RAS and WE signals). Upon the completion of the read from bank 1, a precharge is performed with regards to bank 1.

The next functions performed by the system are a read from address 000102. As is seen, activate commands for bank 0 and bank 1 are initiated, as well as read commands for both banks. In this particular sequence of reads from address 000102, only six words are read from bank 0 while 8 words are read from bank 1. As was described above the indication to start on the third memory cell in this address was stored in the data buffer memory during a previous read. The activate, read, and precharge commands for this address occur as they did for address 004060 described above, but what can be seen in the particular sequence shown is that while the read for bank 1 is being performed with regards to address 0102, the activate command is issued for bank 0 in address 000110. As was stated previously, when the read command for bank 1 occurs, the pending request is cleared and the next request honored. The next request is for the same port as the previous request, the Host, thus the next address, 000110, is sequential. Further, if you look carefully, you can see that the precharge for bank 1 for address 0102 occurs before the read for bank 0 for address 0110 and there is a small gap in the data transfer on "X_SDRAM_DATA". This is because the first transfer to the host was only 14 words and there was not enough time to set up the next transfer. For the next requests (addr 120 and 130, and 4070), the transfers are all 16 word requests and there are no gaps in "X_SDRAM_DATA". As can be seen in this example, even in the switching of addresses for performing the data transfer functions, the various set-up functions (i.e., the activate, and precharge steps) can be hidden. What is also seen in the sequence of reads for HST, that all the reads end on a 16 word boundary thus ensuring that the next function to be performed is begun on bank 0 of the identified address.

In the example shown in the timing diagram of FIG. 6, it is seen that read functions are performed consecutively for the HST source and the MHX source when data is read from addresses 000130 and the 04070, respectively. Even when switching between different data devices, it is seen that the set-up functions are hidden in a manner such that there is no delay. One reason for this is that because the system described herein only allows data requests which occur on a 16 word boundary, the transition between addresses (i.e., bank 1 from the previous address to bank 0 of the new address) is greatly simplified. In short, the more data transfers which may end on bank 1 of a previous address, allow for the easy transition with minimal delay to a transfer of a bank 0 of the next address to be accessed.

The foregoing description of the present invention has been presented for purposes of illustration and description. Furthermore, the description is not intended to limit the invention to the form disclosed herein. Consequently, variations and modifications commensurate with the above teachings, and the skill or knowledge of the relevant art, within the scope of the present invention. The embodiments described hereinabove are further intended to explain best modes known for practicing the invention and to enable others skilled in the art to utilize the invention in such, or other, embodiments and with various modifications required by the particular applications or uses of the present invention. It is intended that the appended claims be construed to include alternative embodiments to the extent permitted by the prior art.

What is claimed is:

1. A method of reading and writing data to a dynamic random access memory (DRAM) comprising the steps of:
   (a) detecting a data transfer request over one or more data ports for performing a transfer of data for a memory array, wherein the data transfer request includes an indication of how much of the data is to be transferred;
   (b) identifying a first address in the memory array and a starting point associated therewith, wherein first the address comprises a plurality of memory banks, and each of the memory banks includes a predetermined number of memory cells and the starting point provides an indication of which of the memory cells the transfer is to begin;
   (c) initiating the data transfer to the first address according to the data transfer request, wherein the data transfer is performed in a substantially sequential manner beginning at the memory cell associated with the starting point and terminating upon a first occurrence of: the data transfer request is fulfilled or a last memory cell in the first address is employed in the data transfer process;
   (d) monitoring the data transfer to the first address to determine if all the data identified in the data transfer request has been transferred;
   (e) if all the data in the data transfer request is transferred, returning to step (a); and
   (f) if all the data in the data transfer request is not transferred to the first address, identifying a portion of the data which was not transferred and generating a new data transfer request which includes the portion of the data which was not transferred and returning to step (a).

2. The method of claim 1 wherein the data transfer includes at least one of: writing data to the memory array and reading data from the memory array.

3. The method of claim 1 wherein the data transfer request is limited to a maximum of 16 words.

4. The method of claim 3 wherein each of the addresses in the memory array includes a 0 memory bank and a 1 memory bank, wherein the bank 1 and the bank 0 have a capacity of 8 words.

5. The method of claim 4 further including the step of performing at least one overhead function for either the bank 1 or 0 while the data transfer is performed for the other bank.

6. The method of claim 5 wherein the overhead functions include at least one of: activating the 0 or 1 bank and precharging the 0 or 1 bank.

7. The method of claim 5 further including the step of performing at least one of the overhead functions to a second address while performing the date transfer for the first address.

8. The method of claim 1 wherein the step of monitoring comprises counting cycles in a data strobe to determine whether the data transfer request has been fulfilled.

9. The method of claim 1 wherein the data transfer request is generated from at least one of: a first in first out (FIFO)

device wherein data transfer occur in a substantially serial manner and a non-FIFO device.

10. The method of claim 1 wherein the data transfer is performed for a synchronous DRAM device.

11. A system for performing data transfers for a dynamic random access memory (DRAM) device comprising:
   a data buffer connectable to a memory array employed in the DRAM device, wherein the memory array comprises a plurality of addresses wherein each address includes a plurality of memory banks and each bank includes a number of memory cells, the data buffer further comprises a data port configurable to receive data requests from an electronic device, and the data buffer is further configured to include a memory employable to store address and starting point information for performing the data transfers in response to the data requests from the electronic device; and
   a control circuit connectable to the data buffer for controlling data transfers for the memory array wherein the control circuit is configured to process the data requests in a manner where the data transfers performed via the data buffer and the memory array, regardless of size, end on a predetermined address boundary in the memory array.

12. The system of claim 11 wherein the data buffer receives the data requests from at least one of: a first-in-first-out (FIFO) device which requests data transfers in a substantially sequential manner and a non-FIFO device.

13. The system of claim 11 wherein each of the addresses in the memory array is configured to receive 16 words and the data requests are limited to 16 words.

14. The system of claim 13 wherein each of the addresses includes a bank 0 and a bank 1 wherein the bank 0 and bank 1 are configured to store 8 words each.

15. A system for performing data transfers for a dynamic random access memory (DRAM) device comprising:
   a data buffer connectable to a memory array employed in the DRAM device, wherein the memory array comprises a plurality of addresses wherein each address includes a plurality of memory banks and each bank includes a number of memory cells, the data buffer further comprises a data port configurable to receive data requests from an electronic device, each of the addresses is configured to receive 16 words and the data requests are limited to 16 words, and each of the addresses includes a bank 0 and a bank 1 wherein the bank 0 and the bank 1 are configured to store 8 words each; and
   a control circuit connectable to the data buffer for controlling data transfers for the memory array wherein the control circuit is configured to process the data requests in a manner where the data transfers performed via the data buffer and the memory array, regardless of size, end on a predetermined address boundary in the memory array, and the control circuit is configured to perform at least one overhead function for either the bank 1 or bank 0 of a particular one of the addresses in the memory array while performing a data transfer for the other bank.

16. The system of claim 15 wherein the overhead functions include at least one of: activating the 0 or 1 bank and precharging the 0 or 1 bank.

17. The system of claim 16 wherein the control circuit is further configured to perform the overhead functions and/or the data transfers for the bank 1 of a first address in the memory array while performing the overhead functions and/or the data transfers for the bank 0 of a second address in the memory array.

18. A system for performing data transfers for a dynamic random access memory (DRAM) device comprising:
   a data buffer connectable to a memory array employed in the DRAM device, wherein the memory array comprises a plurality of addresses wherein each address includes a plurality of memory banks and each bank includes a number of memory cells, the data buffer further comprises a data port configurable to receive data requests from an electronic device; and
   a control circuit connectable to the data buffer for controlling data transfers for the memory array wherein the control circuit is configured to process the data requests in a manner where the data transfers performed via the data buffer and the memory array, regardless of size, end on a predetermined address boundary in the memory array, and the control circuit is further configured to monitor the data transfers wherein starting point information stored in the data buffer is retrieved and a count is performed of words transferred to/from one of the addresses to determine if the predetermined address boundary has been reached.

19. The system of claim 11 wherein the data transfers include at least one of: writing to the memory array and reading from the memory array.

20. The system of claim 11 wherein the DRAM device is a synchronous DRAM (SDRAM) device.

21. A disk drive, comprising:
   an SDRAM memory array that includes a plurality of addresses, wherein each address includes first and second memory banks, and the memory banks each include a plurality of memory cells;
   a data buffer that includes a data port for receiving data requests and data transfers from an electronic device and a memory that stores address and starting point information associated with the data transfers; and
   a control circuit for controlling data transfers between the data buffer and the memory array in response to the data requests, wherein the data transfers end on a predetermined address boundary in the memory array regardless of the size of the data transfers.

22. The disk drive of claim 21, wherein the control circuit simultaneously provides a data transfer for the first memory bank and an overhead function for the second memory bank.

23. The disk drive of claim 22, wherein the overhead function is precharging the second memory bank.

24. The disk drive of claim 22, wherein the overhead function is activating the second memory bank.

25. The disk drive of claim 22, wherein the control circuit simultaneously provides a data transfer for the second memory bank and an overhead function for the first memory bank.

26. The disk drive of claim 21, wherein the control circuit simultaneously provides a first overhead function for the first memory bank and a second overhead function for the second memory bank.

27. The disk drive of claim 26, wherein the first overhead function is precharging the first memory bank, and the second overhead function is activating the second memory bank.

28. The disk drive of claim 21, wherein the control circuit is connected to an addressing circuit, the addressing circuit is connected to a row decoder, a column decoder and the data buffer, the row decoder is connected to the memory array, and the column decoder is connected to the data buffer.

29. The disk drive of claim 21, wherein the electronic device is a processor within the disk drive.

30. The disk drive of claim 21, wherein the electronic device is a host computer external to the disk drive.

31. A disk drive, comprising:
an SDRAM memory array that includes a plurality of addresses, wherein each address includes first and second memory banks, and the memory banks each include a plurality of memory cells;
a data buffer that includes a data port for receiving data requests and data transfers from an electronic device; and
a control circuit for controlling data transfers between the data buffer and the memory array in response to the data requests, wherein the data transfers end on a predetermined address boundary in the memory array regardless of the size of the data transfers, and the control circuit performs an overhead function on the first memory bank while performing a data transfer for the second memory bank.

32. The disk drive of claim 31, wherein the control circuit simultaneously provides a data transfer for the first memory bank and an overhead function for the second memory bank.

33. The disk drive of claim 32, wherein the overhead function is precharging the second memory bank.

34. The disk drive of claim 32, wherein the overhead function is activating the second memory bank.

35. The disk drive of claim 32, wherein the control circuit simultaneously provides a data transfer for the second memory bank and an overhead function for the first memory bank.

36. The disk drive of claim 32, wherein the control circuit simultaneously provides a first overhead function for the first memory bank and a second overhead function for the second memory bank.

37. The disk drive of claim 36, wherein the first overhead function is precharging the first memory bank, and the second overhead function is activating the second memory bank.

38. The disk drive of claim 31, wherein the control circuit is connected to an addressing circuit, the addressing circuit is connected to a row decoder, a column decoder and the data buffer, the row decoder is connected to the memory array, and the column decoder is connected to the data buffer.

39. The disk drive of claim 31, wherein the electronic device is a processor within the disk drive.

40. The disk drive of claim 31, wherein the electronic device is a host computer external to the disk drive.

41. A disk drive, comprising:
an SDRAM memory array that includes a plurality of addresses, wherein each address includes first and second memory banks, and the memory banks each include a plurality of memory cells;
a data buffer that includes a data port for receiving data requests and data transfers from an electronic device; and
a control circuit for controlling data transfers between the data buffer and the memory array in response to the data requests, wherein the data transfers end on a predetermined address boundary in the memory array regardless of the size of the data transfers, and the control circuit monitors the data transfers by retreiving starting point information stored in the data buffer and counting words transferred to/from one of the addresses to determine if the predetermined address boundary has been reached.

42. The disk drive of claim 41, wherein the control circuit simultaneously provides a data transfer for the first memory bank and an overhead function for the second memory bank.

43. The disk drive of claim 42, wherein the overhead function is precharging the second memory bank.

44. The disk drive of claim 42, wherein the overhead function is activating the second memory bank.

45. The disk drive of claim 42, wherein the control circuit simultaneously provides a data transfer for the second memory bank and an overhead function for the first memory bank.

46. The disk drive of claim 41, wherein the control circuit simultaneously provides a first overhead function for the first memory bank and a second overhead function for the second memory bank.

47. The disk drive of claim 46, wherein the first overhead function is precharging the first memory bank, and the second overhead function is activating the second memory bank.

48. The disk drive of claim 41, wherein the control circuit is connected to an addressing circuit, the addressing circuit is connected to a row decoder, a column decoder and the data buffer, the row decoder is connected to the memory array, and the column decoder is connected to the data buffer.

49. The disk drive of claim 41, wherein the electronic device is a processor within the disk drive.

50. The disk drive of claim 41, wherein the electronic device is a host computer external to the disk drive.

* * * * *